United States Patent
Pai (10) Patent No.: US 7,116,153 B2
(45) Date of Patent: Oct. 3, 2006

(54) CIRCUIT FOR DRIVING A DEPLETION-TYPE JFET

(75) Inventor: Chung-Lung Pai, Taipei (TW)

(73) Assignee: Richtek Technology Corp., Hsinchu (TW)

( * ) Notice: Subject to any disclaimer, the term of this patent is extended or adjusted under 35 U.S.C. 154(b) by 0 days.

(21) Appl. No.: 10/842,571

(22) Filed: May 11, 2004

(65) Prior Publication Data

US 2005/0212583 A1    Sep. 29, 2005

(51) Int. Cl.
    *H03K 17/687*    (2006.01)
(52) U.S. Cl. ...................... 327/430; 327/427
(58) Field of Classification Search ............... 327/427, 327/430, 108, 434, 437
    See application file for complete search history.

(56) References Cited

U.S. PATENT DOCUMENTS

| | | | | |
|---|---|---|---|---|
| 4,668,919 A | * | 5/1987 | de Weck | ...................... 330/253 |
| 5,748,019 A | * | 5/1998 | Wong et al. | ................. 327/170 |
| 6,307,223 B1 | * | 10/2001 | Yu | ............................... 257/256 |
| 6,344,768 B1 | * | 2/2002 | Daun-Lindberg et al. | ... 327/424 |
| 6,741,099 B1 | * | 5/2004 | Krugly | ......................... 326/82 |
| 6,753,723 B1 | * | 6/2004 | Zhang | ......................... 327/540 |

FOREIGN PATENT DOCUMENTS

| | | | | |
|---|---|---|---|---|
| JP | 54041771 A | * | 4/1979 | |
| JP | 58054734 A | * | 3/1983 | |

\* cited by examiner

*Primary Examiner*—Quan Tra
(74) *Attorney, Agent, or Firm*—Rosenberg, Klein & Lee (57) ABSTRACT

A circuit for driving a depletion-type JFET comprises a capacitor connected between the gate of the depletion-type JFET and a control signal, and a switch that is controlled by the control signal connected between the gate and source of the depletion-type JFET. The depletion-type JFET is turned on when the control signal is at a high voltage, and is turned off when the control signal is switched to a low voltage. The circuit and its driven depletion-type JFET can be integrated on a single chip to be a new power switch apparatus.

38 Claims, 10 Drawing Sheets

CIRCUIT FOR DRIVING A DEPLETION-TYPE JFET

FIELD OF THE INVENTION

The present invention relates generally to a power junction field-effect transistor (JFET) and, more specifically, to a circuit for driving a depletion-type JFET.

BACKGROUND OF THE INVENTION

FET and bipolar junction transistor (BJT) are well-known electronic devices and have been used for various applications. Even though FET is similar to BJT in its characteristics and functions, it is much simpler and better for use than BJT, because of the non-zero base current and low input impedance inherently possessed by BJT which will result in disadvantages when it is used for circuit applications. There are two typical FETs, i.e., metal-oxide-semiconductor (MOS) FET and JFET. Unfortunately, the well-developed circuits for driving MOSFETs are not applicable for driving JFETs for their different gate driving mechanisms. Therefore, modification is proposed for example by Lovoltech in which parallel resistor and capacitor network is introduced into the driver circuit prior to the gate of the driven JFET in addition to PWM control circuit, see http://www.lovoltech.com/pdf/an100.pdf and http://www.lovoltech.com/pdf/AN 101-112003.pdf.

Figure 1:
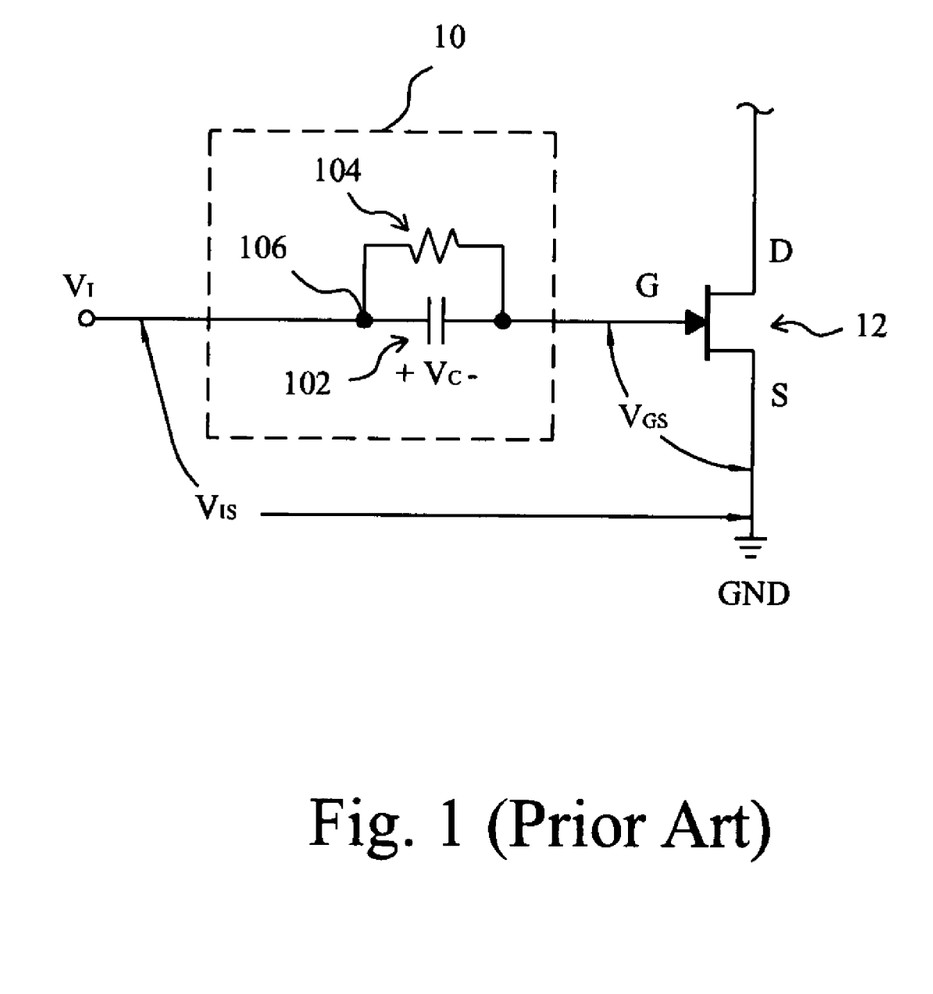
FIG. 1 shows a conventional circuit for driving an N-channel depletion-type JFET.

For more detail, the art proposed by Lovoltech is shown in FIG. 1, in which a parallel resistor and capacitor network 10 for driving an N-channel depletion-type JFET 12 comprises a capacitor 102 connected between a control input 106 and the gate G of the JFET 12, and a resistor 104 connected to the capacitor 102 in parallel. Voltage $V_I$ is applied to the circuit 10 on the control input 106, and thus, the voltage difference between the control input 106 of the circuit 10 and the source of the JFET 12 is $$V_{IS} = V_I - V_S,\qquad \text{EQ-1}$$

where $V_S$ is the voltage on the source of the JFET 12. In this illustration, the source of the JFET 12 is grounded, and it is therefore obtained $$V_{IS} = V_I.\qquad \text{EQ-2}$$

Furthermore, according to Kirchhoff's voltage law, it is obvious that $$V_{IS} = V_C + V_{GS},\qquad \text{EQ-3}$$

where $V_C$ is the voltage drop across the capacitor 102 and $V_{GS}$ is the gate-source voltage of the JFET 12. In combination of the equation EQ-2 with the equation EQ-3, it leads to $$V_{GS} = V_I - V_C.\qquad \text{EQ-4}$$

When the voltage $V_I$ is at a high level, the gate-source voltage $V_{GS}$ of the JFET 12 is positive, since the charged voltage $V_C$ of the capacitor 102 cannot be higher than $V_I$. As a result, the JFET 12 is conductive. When the voltage $V_I$ is switched to a level lower than $V_C$, the gate-source voltage $V_{GS}$ of the JFET 12 becomes negative, resulting in cutoff of the JFET 12.

However, when such apparatus 10 turns on the N-channel depletion-type JFET 12, the gate of the JFET 12 is forward biased and therefore, a very high current is conductive between its gate and source, which makes it not suitable for low power applications such as portable apparatus.

Accordingly, it is desired a circuit for driving a depletion-type JFET without high gate-source current generated when the depletion-type JFET is turned on.

SUMMARY OF THE INVENTION

One object of the present invention is to provide a CMOS compatible circuit for driving a depletion-type JFET.

Another object of the present invention is to provide a circuit for driving a depletion-type JFET by which only a small gate-source current is needed to turn on the depletion-type JFET.

Yet another object of the present invention is to provide a circuit for driving a depletion-type JFET which can be integrated on a single chip with the depletion-type JFET to be a power switch apparatus.

In a circuit for driving an N-channel depletion-type JFET, according to the present invention, a capacitor is connected between a control signal and a gate of the N-channel depletion-type JFET, a switch is connected between the gate and a source of the N-channel depletion-type JFET, which is controlled by the control signal, and a resistor is connected between the control signal and the switch for limiting the current of the switch. When the control signal is at a high level, the switch is turned on, such that the voltage difference between the gate and source of the N-channel depletion-type JFET is zero, thereby turning on the N-channel depletion-type JFET. When the control signal is switched to a low voltage, the switch is turned off, such that the voltage difference between the gate and source of the N-channel depletion-type JFET becomes negative, thereby turning off the N-channel depletion JFET.

In another embodiment, a circuit for driving a P-channel depletion-type JFET comprises a capacitor connected between a control signal and a gate of the P-channel depletion-type JFET, a switch connected between the gate and a source of the P-channel depletion-type JFET, which is controlled by the control signal, and a resistor connected between the control signal and the switch for limiting the current of the switch. When the control signal is at a high level, the switch is turned off, such that the voltage difference between the gate and source of the P-channel depletion-type JFET is positive, thereby turning off the P-channel depletion-type JFET. When the control signal is switched to a low voltage, the switch is turned on, such that the voltage difference between the gate and source of the P-channel depletion-type JFET achieves to zero, thereby turning on the P-channel depletion-type JFET.

In the driving circuits of the present invention, when the N-channel or P-channel depletion-type JFET is turned on, the switch is also turned on, and the switch is not a power device, so that the gate-source current of the N-channel or P-channel depletion-type JFET is dramatically reduced. In addition, the driving circuit of the present invention can be integrated with the driven depletion-type JFET on a single chip to become a new power switch apparatus which can be directly driven by the driver for MOSFET. Moreover, the depletion-type JFET and the switch can be manufactured on a chip by a same semiconductor process, and the capacitor and resistor can be also integrated on the chip.

BRIEF DESCRIPTION OF DRAWINGS

These and other objects, features and advantages of the present invention will become apparent to those skilled in the art upon consideration of the following description of the preferred embodiments of the present invention taken in conjunction with the accompanying drawings, in which.

DETAILED DESCRIPTION OF THE INVENTION

Figure 2:
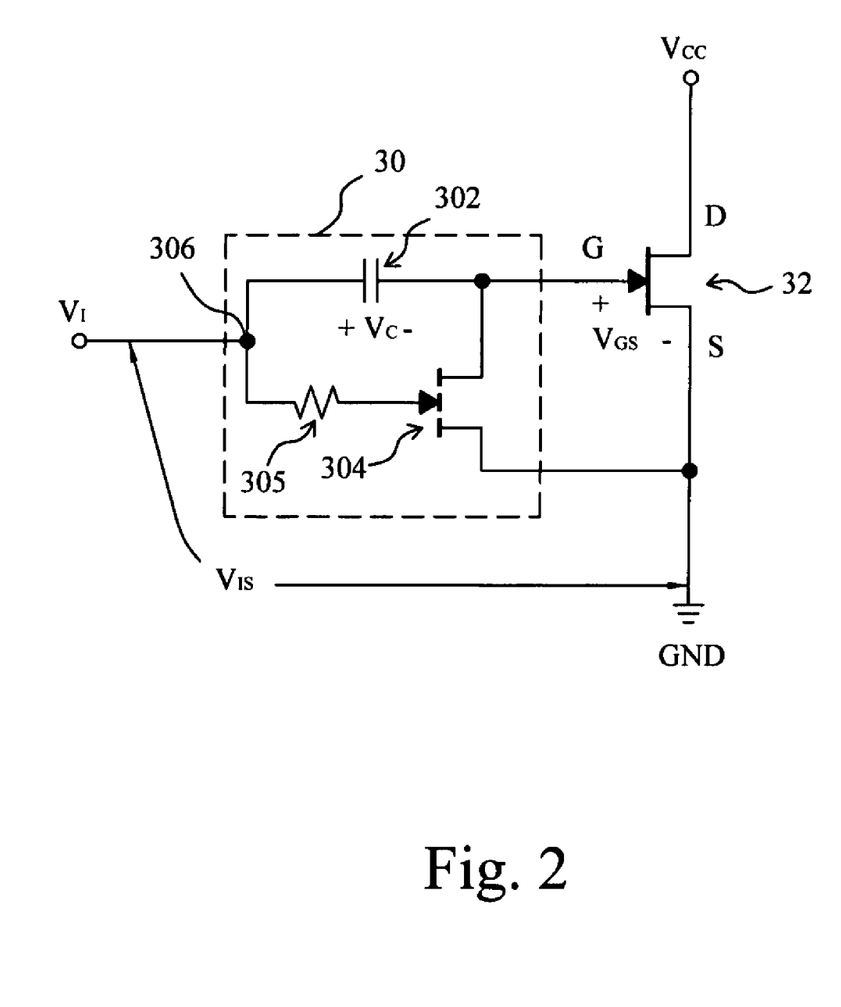
FIG. 2 shows a circuit for driving an N-channel JFET according to the present invention.

FIG. 2 shows a circuit for driving an N-channel JFET according to the present invention. In circuit 30, a capacitor 302 is connected between a control signal $V_I$ and a gate G of an N-channel depletion-type JFET 32, an N-channel enhancement-type JFET 304 is connected between the gate G and a source S of the N-channel depletion-type JFET 32 as a switch and controlled by the control signal $V_I$, and a resistor 305 is connected between the control signal $V_I$ and a gate of the N-channel enhancement-type JFET 304 to limit the gate-source current of the N-channel enhancement-type JFET 304. The N-channel depletion-type JFET 32 and N-channel enhancement-type JFET 304 can be integrated on a single chip and manufactured by a same semiconductor processes. Moreover, the capacitor 302 and resistor 305 can be also integrated on the same single chip. From FIG. 2, the voltage difference between the input 306 of the circuit 30 and the source S of the N-channel depletion-type JFET 32 is $$V_{IS}=V_I-V_S, \qquad \text{EQ-5}$$

where $V_S$ is the voltage on the source S of the N-channel depletion-type JFET 32. Further, in accordance with Kirchhoff's voltage law, it has $$V_{IS}=V_C+V_{GS}, \qquad \text{EQ-6}$$

where $V_{GS}$ is the voltage difference between the gate G and source S of the N-channel depletion-type JFET 32 and $V_C$ is the voltage drop across the capacitor 302. When the control signal $V_I$ is at a high level, for example 3V, the N-channel enhancement-type JFET 304 is turned on and therefore, the voltage difference $V_{GS}$ between the gate G and source S of the N-channel depletion-type JFET 32 is zero, i.e., $V_{GS}=0$, thereby turning on the N-channel depletion-type JFET 32. Since the source S of the N-channel depletion-type JFET 32 is grounded, i.e., $V_S=0$, from EQ-5, the voltage difference $V_{IS}$ between the input 306 and source S of the N-channel depletion-type JFET 32 equals to the control signal $V_I$. Further, from EQ-6, the voltage drop $V_C$ equals to the control signal $V_I$ which is 3V. When the control signal $V_I$ is switched to a low voltage, for example 0V, the N-channel enhancement-type JFET 304 is cutoff, and at this moment, the voltage drop $V_C$ across the capacitor 302 is still 3V. From EQ-6, it is therefore $$0V=3V+V_{GS}, \qquad \text{EQ-7}$$

and thus, at this moment, the voltage difference between the gate G and source S of the N-channel depletion-type JFET 32 is $$V_{GS}=-3V.$$

As a result, the N-channel depletion-type JFET 32 is turned off.

Figure 3:
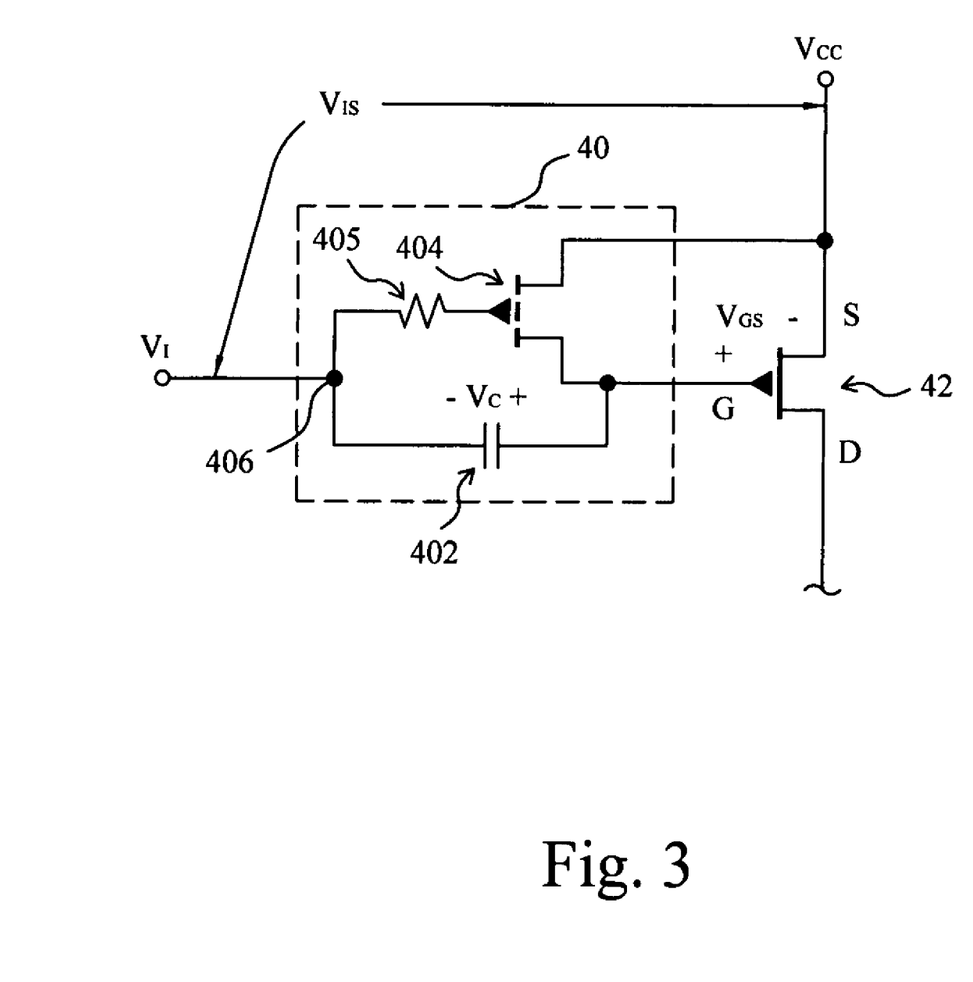
FIG. 3 shows a circuit for driving a P-channel JFET according to the present invention.

FIG. 3 shows a circuit for driving a P-channel JFET according to the present invention. In circuit 40, a capacitor 402 is connected between a control signal $V_I$ and a gate G of a P-channel depletion-type JFET 42, a P-channel enhancement-type JFET 404 is connected between the gate G and source S of the P-channel depletion-type JFET 42 as a switch and controlled by the control signal $V_I$, a resistor 405 is connected between the control signal $V_I$ and the gate of the P-channel enhancement-type JFET 404 to limit the gate-source current of the P-channel enhancement-type JFET 404. Again, the P-channel depletion-type JFET 42 and P-channel enhancement-type JFET 404 can be integrated on a single chip and manufactured by a same semiconductor processes, and the capacitor 402 and resistor 405 can be also integrated on the same single chip. From FIG. 3, the voltage difference between the input 406 of the circuit 40 and the source S of the P-channel depletion-type JFET 42 is $$V_{IS}=V_I-V_S=V_I-V_{CC}, \qquad \text{EQ-8}$$

where $V_S$ is the voltage on the source S of the P-channel depletion-type JFET 42. Further, in accordance with Kirchhoff's voltage law, it has $$V_{IS}+V_C=V_{GS}, \qquad \text{EQ-9}$$

where $V_{GS}$ is voltage difference between the gate G and source S of the P-channel depletion-type JFET 42 and $V_C$ is the voltage drop across the capacitor 402. When the control signal $V_I$ is at a low level, for example 2V, the P-channel enhancement-type JFET 404 is turned on and therefore, the voltage difference $V_{GS}$ between the gate G and source S of the P-channel depletion-type JFET 42 is zero, i.e., $V_{GS}=0$, thereby turning on the P-channel depletion-type JFET 42. Assuming that the power source supplied voltage $V_{CC}$ connected to the source S of the P-channel depletion-type JFET 42 is 5V, and, from EQ-8, the voltage difference $V_{IS}$ between the input 406 and the source S of the P-channel depletion-type JFET 42 is −3V, it is obtained from EQ-9

$$-3V+V_C=0V. \qquad \text{EQ-10}$$

Therefore, the charging voltage is $$V_C=3V.$$

When the control signal $V_I$ is switched to a high voltage, for example 5V, the P-channel enhancement-type JFET 404 is turned off. From EQ-8, the voltage difference $V_{IS}$ between the input 406 and the source S of the P-channel depletion-type JFET 42 is zero, i.e., $V_{IS}=0$, and at this moment, the voltage drop $V_C$ across the capacitor 402 is still 3V. From EQ-9, it is therefore $$0V + 3V = V_{GS},\qquad \text{EQ-11}$$

and thus, at this moment, the voltage difference between the gate G and source S of the P-channel depletion-type JFET 42 is $$V_{GS} = 3V.$$

As a result, the P-channel depletion-type JFET 42 is turned off.

Either the N-channel enhancement-type JFET 302 or the P-channel enhancement-type JFET 402 in the aforementioned embodiments can be replaced with other switch devices.

Figure 4:
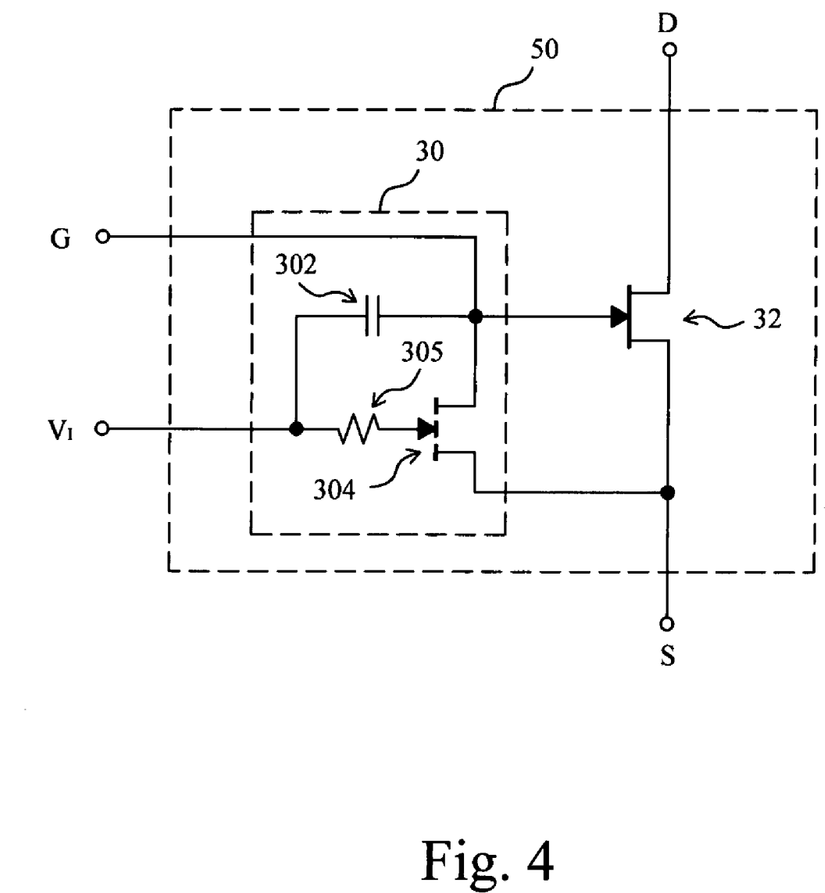
FIG. 4 shows a first embodiment power switch apparatus by integrating a driving circuit of the present invention with the driven depletion-type JFET.

Furthermore, the driving circuit of the present invention and the driven JFET can be integrated on a single chip, such that a new device is obtained for a power switch apparatus. FIG. 4 shows a first embodiment power switch apparatus by integrating a driving circuit of the present invention with the driven depletion-type JFET. In a power switch apparatus 50, the aforementioned circuit 30 and N-channel depletion-type JFET 32 are integrated on a single chip, with the drain pin D of the apparatus 50 connected to the drain of the N-channel depletion-type JFET 32, the source pin S of the apparatus 50 connected to the source of the N-channel depletion-type JFET 32, the gate pin G of the apparatus 50 connected to the gate of the N-channel depletion-type JFET 32, and the control input pin $V_I$ connected to the capacitor 302 and resistor 305, as shown in FIG. 4. The N-channel depletion-type JFET 32 and N-channel enhancement-type JFET 304 can be manufactured on the chip by the same semiconductor process, and the capacitor 302 and resistor 305 are also integrated on the chip.

Figure 5:
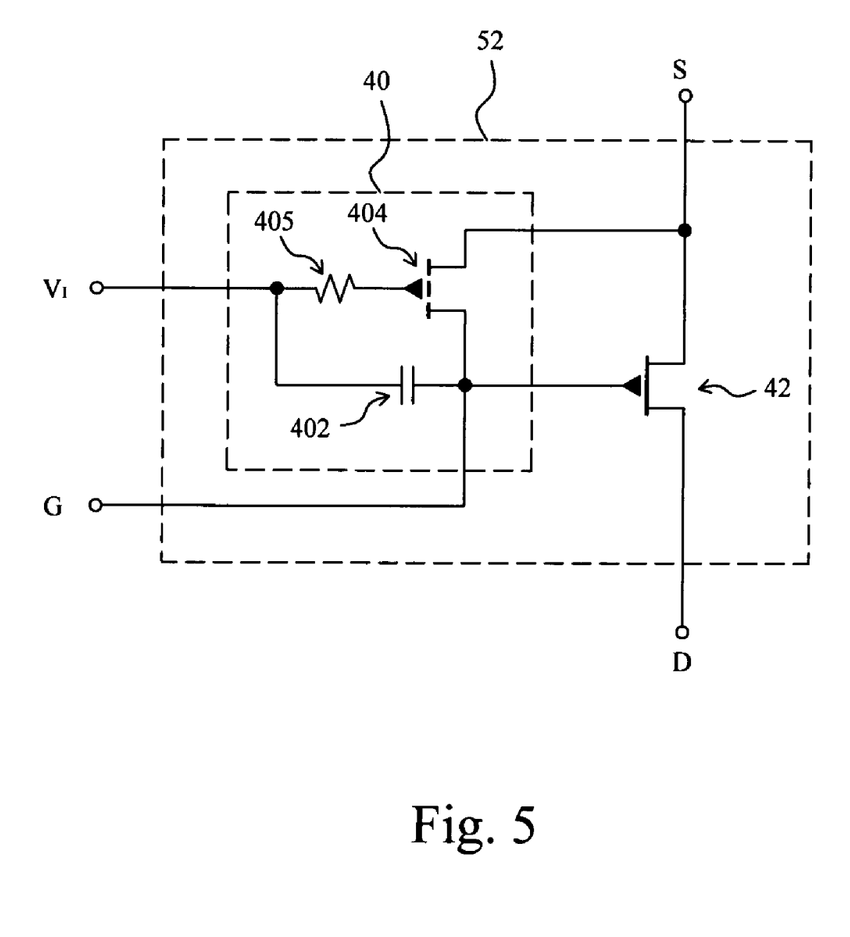
FIG. 5 shows a second embodiment power switch apparatus by integrating a driving circuit of the present invention with the driven depletion-type JFET.

FIG. 5 shows a second embodiment power switch apparatus by integrating a driving circuit of the present invention with the driven depletion-type JFET. In a power switch apparatus 52, the aforementioned circuit 40 and P-channel depletion-type JFET 42 are integrated on a single chip, with the drain pin D of the power switch apparatus 52 connected to the drain of the P-channel depletion-type JFET 42, the source pin S of the power switch apparatus 52 connected to the source of the P-channel depletion-type JFET 42, the gate pin G of the power switch apparatus 52 connected to the gate of the P-channel depletion-type JFET 42, and the control input pin $V_I$ of the power switch apparatus 52 connected to the capacitor 402 and resistor 405, as shown in FIG. 5. Likewise, the P-channel depletion-type JFET 42 and P-channel enhancement-type JFET 404 can be manufactured on the chip by the same semiconductor process, and the capacitor 402 and resistor 405 are also integrated on the chip.

Figure 6:
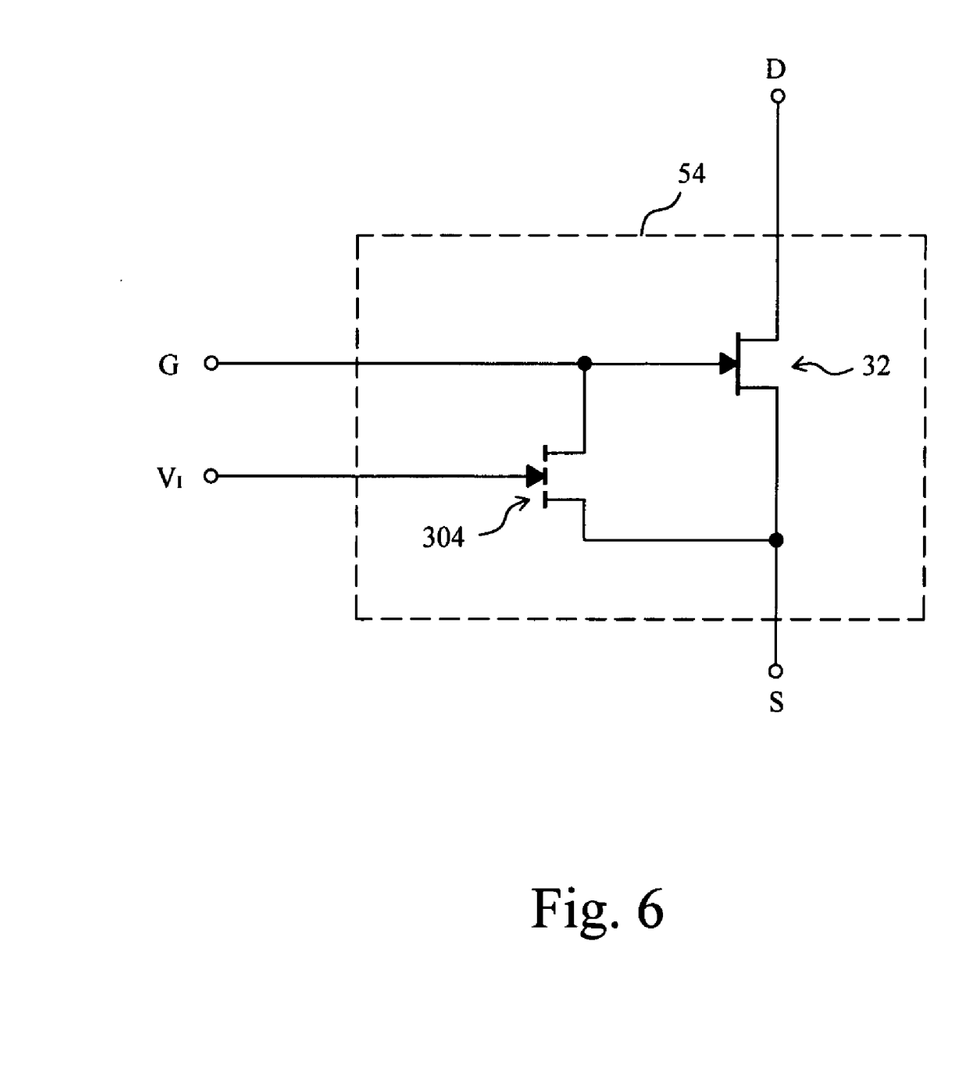
FIG. 6 shows a third embodiment power switch apparatus by integrating a driving circuit of the present invention with the driven depletion-type JFET.

FIG. 6 shows a third embodiment power switch apparatus by integrating a driving circuit of the present invention with the driven depletion-type JFET. In a power switch apparatus 54, the N-channel depletion-type JFET 32 and N-channel enhancement-type JFET 304 are integrated on a single chip, with the drain pin D of the power switch apparatus 54 connected to the drain of the N-channel depletion-type JFET 32, the source pin S of the power switch apparatus 54 connected to the source of the N-channel depletion-type JFET 32, the gate pin G of the power switch apparatus 54 connected to the gate of the N-channel depletion-type JFET 32, and the control input pin $V_I$ of the power switch apparatus 54 connected to the gate of the N-channel enhancement-type JFET 304. The N-channel depletion-type JFET 32 and N-channel enhancement-type JFET 304 are manufactured on the chip by the same semiconductor process.

Figure 7:
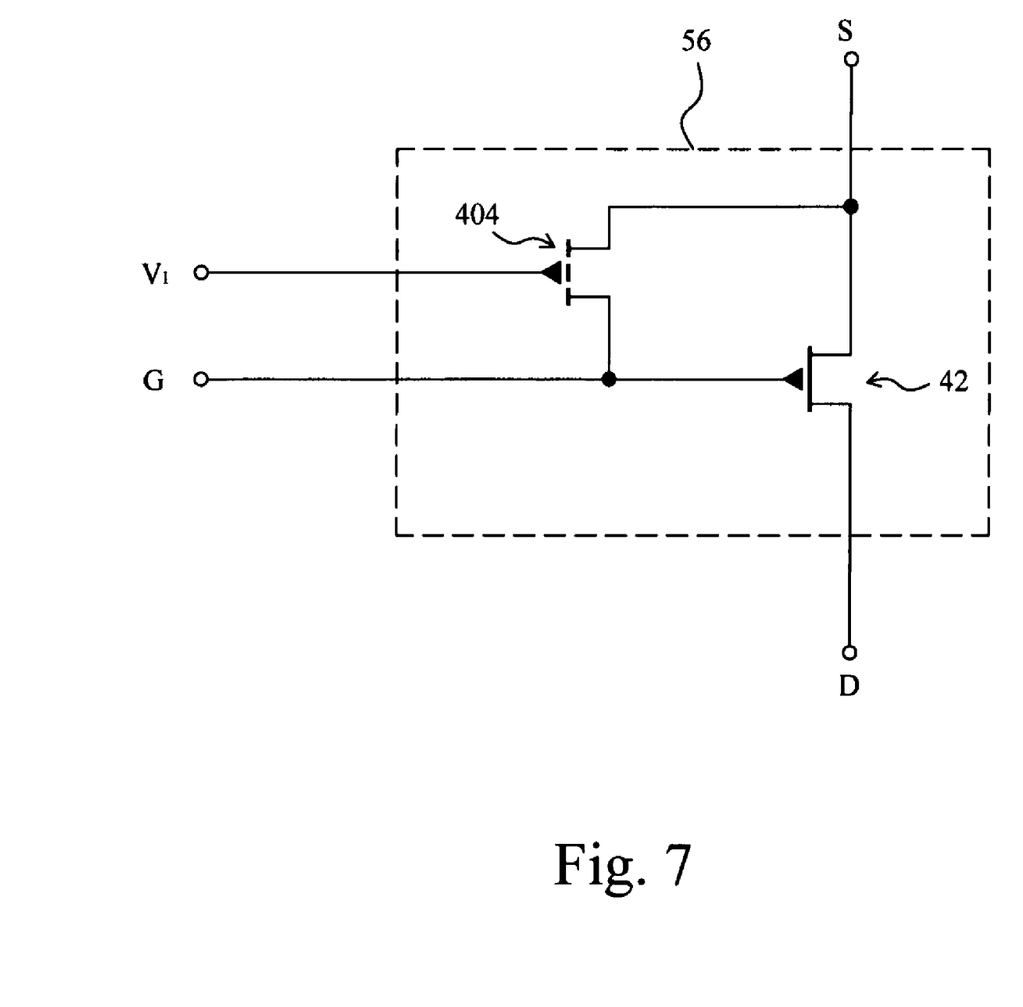
FIG. 7 shows a fourth embodiment power switch apparatus by integrating a driving circuit of the present invention with the driven depletion-type JFET.

FIG. 7 shows a fourth embodiment power switch apparatus by integrating a driving circuit of the present invention with the driven depletion-type JFET. In a power switch apparatus 56, the P-channel depletion-type JFET 42 and P-channel enhancement-type JFET 404 are integrated on a single chip, with the drain pin D of the power switch apparatus 56 connected to the drain of the P-channel depletion-type JFET 42, the source pin S of the power switch apparatus 56 connected to the source of the P-channel depletion-type JFET 42, the gate pin G of the power switch apparatus 56 connected to the gate of the P-channel depletion-type JFET 42, and the control input pin $V_I$ of the power switch apparatus 56 connected to the gate of the P-channel enhancement-type JFET 404. The P-channel depletion-type JFET 42 and P-channel enhancement-type JFET 404 are manufactured on the chip by the same semiconductor process.

Figure 8:
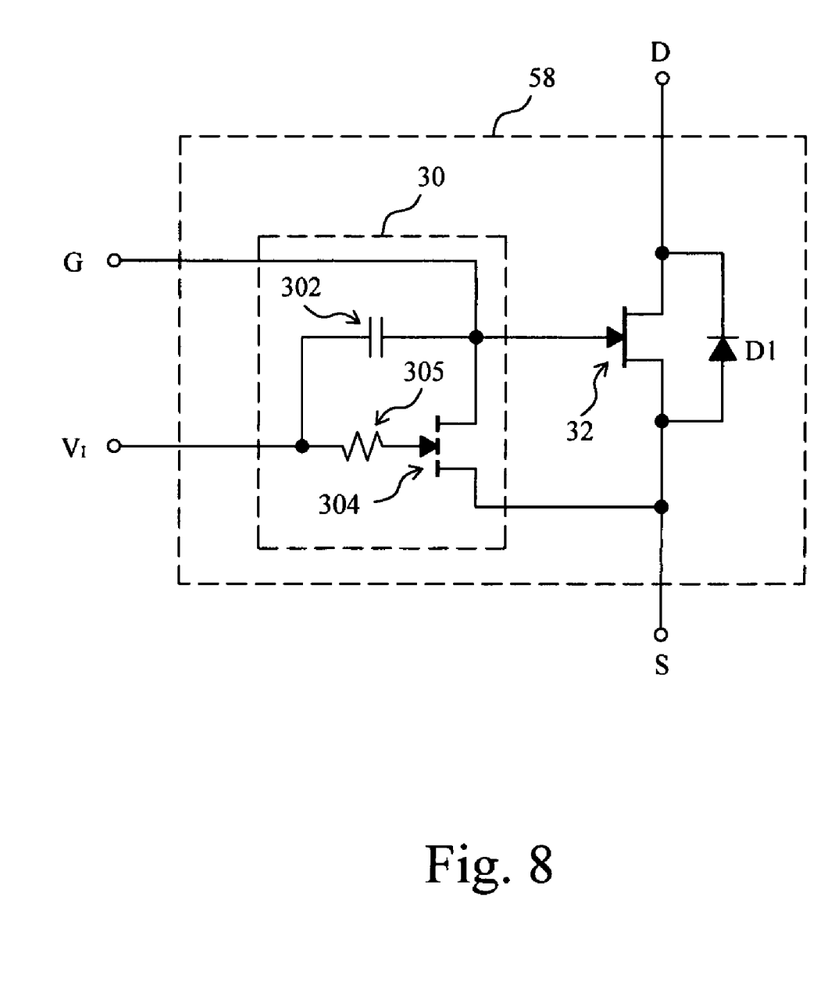
FIG. 8 shows a fifth embodiment power switch apparatus by integrating a driving circuit of the present invention with the driven depletion-type JFET.

FIG. 8 shows a fifth embodiment power switch apparatus by integrating a driving circuit of the present invention with the driven depletion-type JFET. In a power switch apparatus 58, the aforementioned circuit 30, N-channel depletion-type JFET 32, and a diode D1 are integrated on a single chip. The diode D1 is connected between the source and drain of the N-channel depletion-type JFET 32, such that a conductive loop is still provided when the N-channel depletion-type JFET 32 is turned off. The power switch apparatus 58 has its drain pin D connected to the drain of the N-channel depletion-type JFET 32, source pin S connected to the source of the N-channel depletion-type JFET 32, gate pin G connected to the gate of the N-channel depletion-type JFET 32, and control input pin $V_I$ connected to the capacitor 302 and resistor 305. The N-channel depletion-type JFET 32 and N-channel enhancement-type JFET 304 are manufactured on the chip by the same semiconductor process, and the capacitor 302, resistor 305, and diode D1 are also integrated on the chip.

Figure 9:
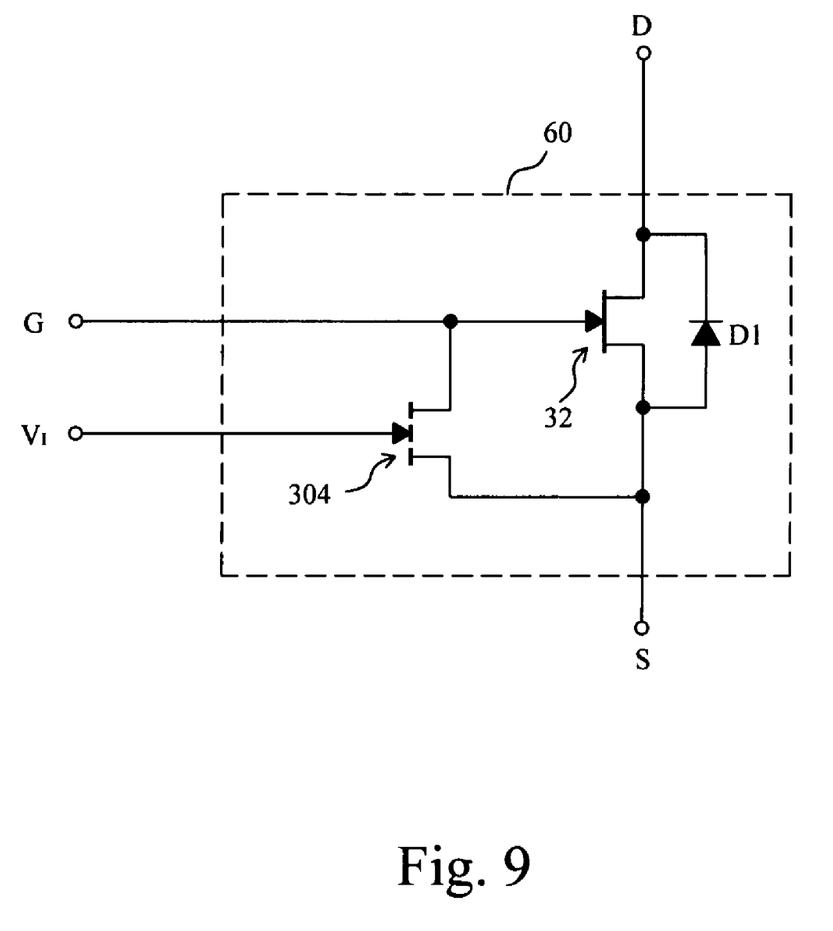
FIG. 9 shows a sixth embodiment power switch apparatus by integrating a driving circuit of the present invention with the driven depletion-type JFET.

FIG. 9 shows a sixth embodiment power switch apparatus by integrating a driving circuit of the present invention with the driven depletion-type JFET. In a power switch apparatus 60, the N-channel depletion-type JFET 32, N-channel enhancement-type JFET 304, and a diode D1 are integrated on a single chip. The diode D1 is connected between the source and drain of the N-channel depletion-type JFET 32, such that a conductive loop is still provided when the N-channel depletion-type JFET 32 is turned off. The power switch apparatus 60 has its drain pin D connected to the drain of the N-channel depletion-type JFET 32, source pin S connected to the source of the N-channel depletion-type JFET 32, gate pin G connected to the gate of the N-channel depletion-type JFET 32, and control input pin $V_I$ connected to the gate of the N-channel enhancement-type JFET 304. The N-channel depletion-type JFET 32 and N-channel enhancement-type JFET 304 are manufactured on the chip by the same semiconductor process, and the diode D1 is also integrated on the chip.

The aforementioned six power switch apparatus 50–60 can be modified, for example by replacing the N-channel enhancement-type JFETs 304 and 404 with other switch devices.

Figure 10:
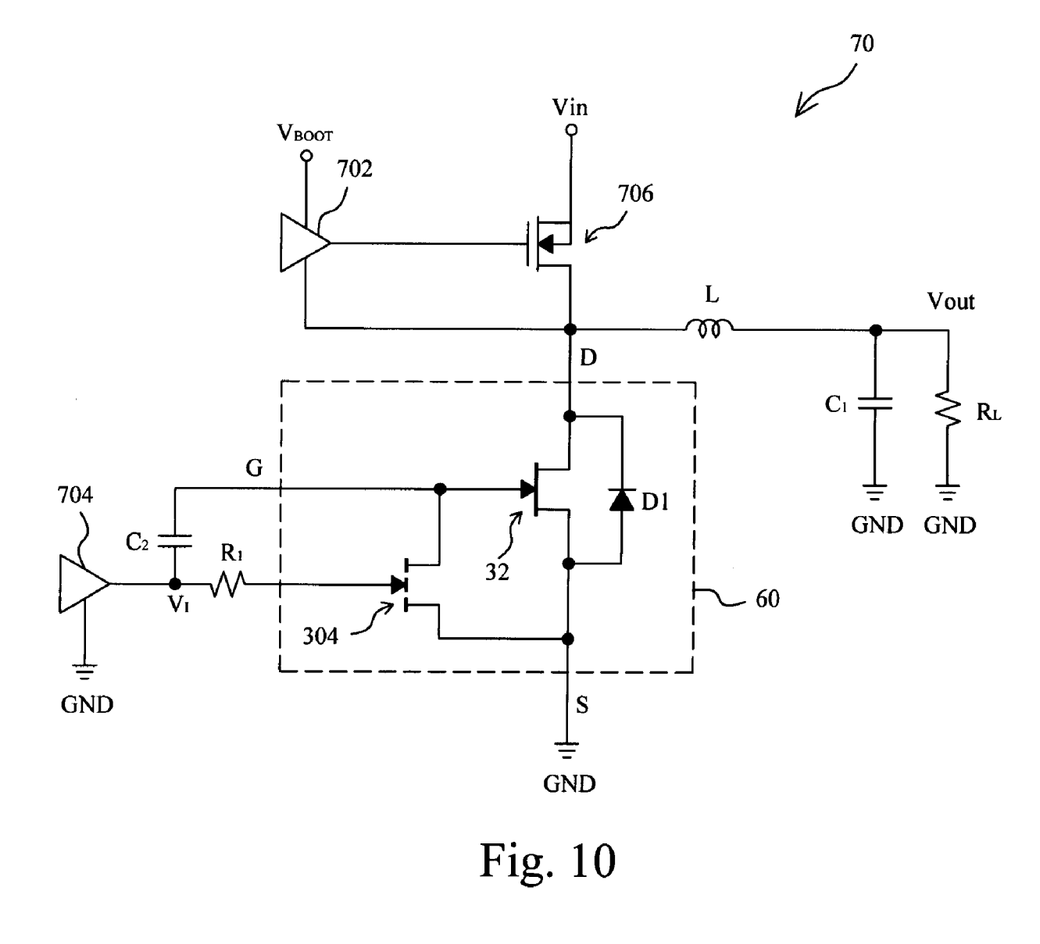
FIG. 10 shows a driving circuit of the present invention applied in a synchronous buck converter.

FIG. 10 shows the power switch apparatus 60 applied in a synchronous buck converter. In a converter 70, two drivers 702 and 704 alternatively switch a MOSFET 706 and the power switch apparatus 60 to generate an output voltage Vout to supply to a load $R_L$. Between the gate pin G of the power switch apparatus 60 and the control signal $V_I$ from the driver 704 is connected with a capacitor $C_2$, and a resistor $R_1$ is inserted between the control signal $V_I$ and the control input pin of the power switch apparatus 60 to serve as a current limiter for the N-channel enhancement-type JFET 304. By this illustrative embodiment, it is shown that the power switch apparatus 60 is compatible to conventional CMOS driver. In other words, the power switch apparatus 60 can be directly driven by the driver of a MOSFET. In the same manner, those skilled in the art should understand that the other embodiments that have illustrated and their modifications and variations are also compatible to conventional CMOS driver.

While the present invention has been described in conjunction with preferred embodiments thereof, it is evident that many alternatives, modifications and variations will be apparent to those skilled in the art. Accordingly, it is intended to embrace all such alternatives, modifications and variations that fall within the spirit and scope thereof as set forth in the appended claims.

What is claimed is:

1. A circuit for driving a depletion-type JFET having a drain, a source and a gate, said circuit comprising:
   a capacitor connected between said gate and a control signal; and
   a switch connected between said gate and source, said switch having a control input for receiving said control signal, wherein said switch comprises an N-channel enhancement-type JFET.

2. A circuit for driving a depletion-type JFET having a drain, a source and a gate, said circuit comprising:
   a capacitor connected between said gate and a control signal; and
   a switch connected between said gate and source, said switch having a control input for receiving said control signal, wherein said switch comprises a P-channel enhancement-type JFET.

3. The circuit of claim 1, wherein said capacitor and switch are integrated with said depletion-type JFET in a single chip.

4. The circuit of claim 3, wherein said capacitor and switch are manufactured by a semiconductor process of manufacturing said depletion-type JFET.

5. The circuit of claim 1, wherein said switch is integrated with said depletion-type JFET in a single chip.

6. The circuit of claim 5, wherein said switch is manufactured by a semiconductor process of manufacturing said depletion-type JFET.

7. A circuit for driving a depletion-type JFET having a drain, a source and a gate, said circuit comprising:
   a capacitor connected between said gate and a control signal;
   a switch connected between said gate and source, said switch having a control input for receiving said control signal, said circuit generating at an output thereof a gate driving voltage turning ON and OFF said depletion-type JFET when coupled between the gate and the source thereof; and
   a current limiter connected between said control input and control signal.

8. The circuit of claim 7, wherein said capacitor, switch and current limiter are integrated with said depletion-type JFET in a single chip.

9. The circuit of claim 8, wherein said capacitor, switch and current limiter are manufactured by a semiconductor process of manufacturing said depletion-type JFET.

10. A power switch apparatus comprising:
    a depletion-type JFET having a drain, a source and a gate; and
    a switch connected between said gate and source, said switch having a control input for receiving a control signal, said switch outputting at an output thereof a gate driving voltage turning ON and OFF said depletion-type JFET when coupled between the gate and the source thereof, said switch including an N-channel enhancement-type JFET.

11. The power switch apparatus of claim 10, wherein said depletion-type JFET is an N-channel JFET.

12. The power switch apparatus of claim 10, wherein said depletion-type JFET is a P-channel JFET.

13. A power switch apparatus comprising:
    a depletion-type JFET having a drain, a source and a gate; and
    a switch connected between said gate and source, said switch having a control input for receiving a control signal, said switch outputting at an output thereof a gate driving voltage turning ON and OFF said depletion-type JFET when coupled between the gate and the source thereof, said switch including a P-channel enhancement-type JFET.

14. The power switch apparatus of claim 10, wherein said depletion-type JFET and switch are integrated in a single chip.

15. The power switch apparatus of claim 14, wherein said depletion-type JFET and switch are manufactured by a semiconductor process.

16. The power switch apparatus of claim 10, further comprising a capacitor connected between said gate and control signal.

17. The power switch apparatus of claim 16, wherein said depletion-type JFET, switch and capacitor are integrated in a single chip.

18. The power switch apparatus of claim 17, wherein said depletion-type JFET, switch and capacitor are manufactured by a semiconductor process.

19. The power switch apparatus of claim 10, further comprising a diode connected between said drain and source.

20. The power switch apparatus of claim 19, wherein said depletion-type JFET, switch and diode are integrated in a single chip.

21. The power switch apparatus of claim 20, wherein said depletion-type JFET, switch and diode are manufactured by a semiconductor process.

22. A power switch apparatus comprising:
    a depletion-type JFET having a drain, a source and a gate;
    a switch connected between said gate and source, said switch having a control input for receiving a control signal, said switch outputting at an output thereof a gate driving voltage turning ON and OFF said depletion-type JFET when coupled between the gate and the source thereof; and
    a current limiter connected between said control input and control signal.

23. The power switch apparatus of claim 22, wherein said depletion-type JFET, switch and current limiter are integrated in a single chip.

24. The power switch apparatus of claim 23, wherein said depletion-type JFET, switch and current limiter are manufactured by a semiconductor process.

25. The circuit of claim 2, wherein said capacitor and switch are integrated with said depletion-type JFET in a single chip.

26. The circuit of claim 25, wherein said capacitor and switch are manufactured by a semiconductor process of manufacturing said depletion-type JFET.

27. The circuit of claim 2, wherein said switch is integrated with said depletion-type JFET in a single chip.

28. The circuit of claim 27, wherein said switch is manufactured by a semiconductor process of manufacturing said depletion-type JFET.

29. The power switch apparatus of claim 13, wherein said depletion-type JFET is an N-channel JFET.

30. The power switch apparatus of claim 13, wherein said depletion-type JFET is a P-channel JFET.

31. The power switch apparatus of claim 13, wherein said depletion-type JFET and switch are integrated in a single chip.

32. The power switch apparatus of claim 31, wherein said depletion-type JFET and switch are manufactured by a semiconductor process.

33. The power switch apparatus of claim 13, further comprising a capacitor connected between said gate and control signal.

34. The power switch apparatus of claim 33, wherein said depletion-type JFET, switch and capacitor are integrated in a single chip.

35. The power switch apparatus of claim 34, wherein said depletion-type JEET, switch and capacitor are manufactured by a semiconductor process.

36. The power switch apparatus of claim 13, further comprising a diode connected between said drain and source.

37. The power switch apparatus of claim 36, wherein said depletion-type JFET, switch and diode are integrated in a single chip.

38. The power switch apparatus of claim 37, wherein said depletion-type JFET, switch and diode are manufactured by a semiconductor process.

* * * * *